US012604538B2

(12) United States Patent
Shen et al.

(10) Patent No.: US 12,604,538 B2
(45) Date of Patent: Apr. 14, 2026

(54) LAYER STACK FOR THIN-FILM PHOTOVOLTAIC MODULES AND PREPARATION METHOD THEREOF

(71) Applicants: CNBM RESEARCH INSTITUTE FOR ADVANCED GLASS MATERIALS GROUP CO., LTD., Bengbu (CN); TRIUMPH SCIENCE & TECHNOLOGY GROUP CO., LTD., Beijing (CN)

(72) Inventors: Yilei Shen, Munich (DE); Torben Klinkert, Munich (DE)

(73) Assignees: CNBM RESEARCH INSTITUTE FOR ADVANCED GLASS MATERIALS GROUP CO., LTD., Bengbu (CN); TRIUMPH SCIENCE & TECHNOLOGY GROUP CO., LTD., Beijing (CN)

( * ) Notice: Subject to any disclaimer, the term of this patent is extended or adjusted under 35 U.S.C. 154(b) by 125 days.

(21) Appl. No.: 18/565,529

(22) PCT Filed: May 17, 2022

(86) PCT No.: PCT/CN2022/093242
§ 371 (c)(1),
(2) Date: Nov. 30, 2023

(87) PCT Pub. No.: WO2023/220911
PCT Pub. Date: Nov. 23, 2023

(65) Prior Publication Data
US 2024/0258448 A1 Aug. 1, 2024

(51) Int. Cl.
*H10F 19/33* (2025.01)
*H10F 19/35* (2025.01)
*H10F 77/20* (2025.01)

(52) U.S. Cl.
CPC ............. *H10F 19/33* (2025.01); *H10F 19/35* (2025.01); *H10F 77/215* (2025.01)

(58) Field of Classification Search
CPC ......... H10F 19/33; H10F 19/35; H10F 77/215
See application file for complete search history.

(56) References Cited

U.S. PATENT DOCUMENTS

2010/0258167 A1* 10/2010 Chang ................. H10F 77/1698
136/254
2013/0305528 A1* 11/2013 Anderson ............... H02S 40/34
29/825
(Continued)

FOREIGN PATENT DOCUMENTS

CN 105794000 A 7/2016
CN 105990467 A 10/2016
(Continued)

*Primary Examiner* — Jayne L Mershon
(74) *Attorney, Agent, or Firm* — Bayramoglu Law Offices LLC

(57) ABSTRACT

A layer stack for thin-film photovoltaic modules includes a back electrode, an absorber, a buffer/i-layer, a front electrode and an interlayer which are sequentially stacked on a corresponding substrate from bottom up by vacuum coating deposition. The layer stack is divided by P1, P2 and P3 structure lines respectively. A conductive metal grid is embedded in the layer stack, and the metal grid is deposited on the buffer/i-layer before or after the P2 structure line. According to the present invention, the conductive metal grid is embedded in the layer stack, and the metal grid is deposited on the buffer/i-layer before or after the P2 structure line, thereby forming an embedded grid, and thus, the front electrode and the interlayer can be deposited without breaking vacuum in the process sequence. The embedded grid reduces capital expenditure and operating cost.

13 Claims, 6 Drawing Sheets

(56)     References Cited

U.S. PATENT DOCUMENTS

2021/0265517 A1      8/2021   Tno
2023/0073735 A1 *   3/2023   Muzzillo ............... H10F 71/138

FOREIGN PATENT DOCUMENTS

| | | | |
|---|---|---|---|
| CN | 111628012 | A | 9/2020 |
| CN | 111900218 | A | 11/2020 |
| EP | 3799134 | A1 | 3/2021 |
| FR | 3083369 | A1 | 1/2020 |
| JP | H10275920 | A | 10/1998 |
| JP | 2012160511 | A | 8/2012 |
| TW | 201037845 | A | 10/2010 |

* cited by examiner

LAYER STACK FOR THIN-FILM PHOTOVOLTAIC MODULES AND PREPARATION METHOD THEREOF

CROSS REFERENCE TO THE RELATED APPLICATIONS

This application is the national phase entry of International Application No. PCT/CN2022/093242, filed on May 17, 2022, the entire contents of which are incorporated herein by reference.

TECHNICAL FIELD

The present invention belongs to the field of CIGS thin-film solar cell technology, and particularly relates to a layer stack for thin-film photovoltaic modules and a preparation method thereof.

BACKGROUND

As we know, continuous vacuum coating machines can reduce a lot of capital expenditure cost of vacuum coating aggregate for more subsequent layers without vacuum breaking. In addition, in the process of manufacturing, more vacuum breaking will lead to shorter normal operation time before reaching a desired vacuum degree. However, more frequent vacuum switching will shorten the service life of a vacuum turbopump, i.e., increasing the OPEX cost. Therefore, thin-film photovoltaic production needs a continuous process with less vacuum breaking.

With regard to current thin-film photovoltaic manufacturing, vacuum coating is still a common method to deposit most solar module layers (e.g. back electrodes, absorbers, buffer/i-layers, front electrodes and interlayers). However, there also exist some process steps, e.g. solution treatment of a metal grid or a subsequent P3 structure, which may lead to process interruption between the vacuum depositions of subsequent layers. Therefore, thin-film photovoltaic production needs to combine various vacuum coating processes to the max to reduce cost and increase normal operation time. In this way, it is necessary to design a new layer stack design for thin-film solar modules with metal grids, so as to rearrange metal grid printing and a P3 structure in the order of a production process to reduce cost.

In an applied layer stack as shown in FIG. 1, P2 needs to approach before the deposition of a front electrode and after a buffer/i-layer, in order to contact a back electrode and the front electrode for connection of cells in series. Normally, vacuum breaking between the buffer/i-layer and the front electrode cannot be avoided. However, the process of solution treatment of a metal grid and a P3 structure occurs between the depositions of a front electrode and an interlayer of a layer stack of a standard thin-film photovoltaic module as shown in FIG. 4.

SUMMARY

Aiming at the defects existing in the prior art, the present invention provides a layer stack for thin-film photovoltaic modules and a preparation method thereof. The specific technical solution is as follows:

A layer stack for thin-film photovoltaic modules is composed of a back electrode, an absorber, a buffer/i-layer, a front electrode and an interlayer which are sequentially stacked on a corresponding substrate from bottom up by vacuum coating deposition; the layer stack is divided by P1, P2 and P3 structure lines respectively;

A conductive metal grid is embedded in the layer stack, and the metal grid is deposited on the buffer/i-layer before or after the P2 structure line.

Further, the layer stack is also provided with a pattern area, which includes a P1 patterned line groove with the back electrode removed, a P2 patterned line groove close to the P1 structure line with the absorber removed, and a P3 patterned line groove close to the P2 structure line, the metal grid is perpendicular to the P1, P2 and P3 structure lines, and the metal grid outside the pattern area is located between the buffer/i-layer and the front electrode.

Further, the metal grid is made of any of silver, copper, and aluminum.

Further, the metal grid is deposited by different solution deposition methods.

Further, the solution deposition method is any of inkjet printing, aerosol printing, screen printing, and electroplating.

Further, a solvent of conductive ink applied to the metal grid does not directly dissolve or react with the buffer/i-layer.

Further, the surface tension of the conductive ink is greater than the surface energy of the buffer/i-layer.

Further, the surface energy of the buffer/i-layer is lower than that of the front electrode.

Further, the front electrode is made of a transparent conductive oxide material.

Further, the front electrode is made of any of aluminum-doped zinc oxide, boron-doped zinc oxide, indium-doped zinc oxide, indium-doped tin oxide, and fluorine-doped tin oxide.

Further, the interlayer is made of a non-conductive transparent material, and its refractive index is between that of glass and laminated foil and that of transparent conductive oxides.

Further, the interlayer is made of any of silicon nitride and aluminum oxide.

A preparation method for the layer stack for thin-film photovoltaic modules includes the following steps:

depositing a cell stack with a back electrode first; removing the back electrode to form the cell separation of a P1 structure line; then depositing an absorber and a buffer/i-layer, and a P2 patterned line groove beside the P1 structure line being a P2 patterned line groove formed by first removing the absorber and then depositing a metal grid perpendicular to the P1 structure line and the P2 structure line or first depositing a metal grid perpendicular to the P1 structure line and then removing the metal grid and the absorber; then depositing a front electrode and an interlayer, and forming a P3 patterned line groove beside the P2 structure line, so that the P1 structure line and the P3 structure line are positioned at different sides of the P2 structure line by removing at least the front electrode material, and the metal grid being perpendicularly positioned between the buffer/i-layer and the front electrode.

The advantages of the present invention are as follows:

According to the present invention, the conductive metal grid is embedded in the layer stack, and the metal grid is deposited on the buffer/i-layer before or after the P2 structure line, thereby forming an embedded grid, and thus, the front electrode and the interlayer can be deposited without breaking vacuum in the process sequence; and compared with the application of a standard thin-film photovoltaic modules on a front electrode, such an embedded grid shows great advantages in reducing capital expenditure and operating cost.

DETAILED DESCRIPTION OF THE EMBODIMENTS

In order to make the objective, technical solution and advantages of the present invention clearer, the present invention is further described in detail below in reference to embodiments. It should be understood that the specific embodiments described herein are only used to explain the present invention rather than to limit the present invention.

The explanation of the prior art is as follows:

A thin-film photovoltaic module laminated in a certain way is composed of a back electrode, an absorber, a buffer/i-layer/i layer, a front electrode and a certain interlayer in sequence. Here, the interlayer is an optional layer of the thin-film photovoltaic module, which is configured to optimize light coupling into an active area, adjust the color appearance of a BIPV (Building Integrated Photovoltaics) application or improve some mechanical properties, e.g. the adhesion of a laminated glass photovoltaic module. Because of the low voltage and large area of cells, most modules are so designed that respective cells are interconnected in series as individuals to avoid high current loss. However, this will increase the total operating voltage in a photovoltaic module.

Figure 1:
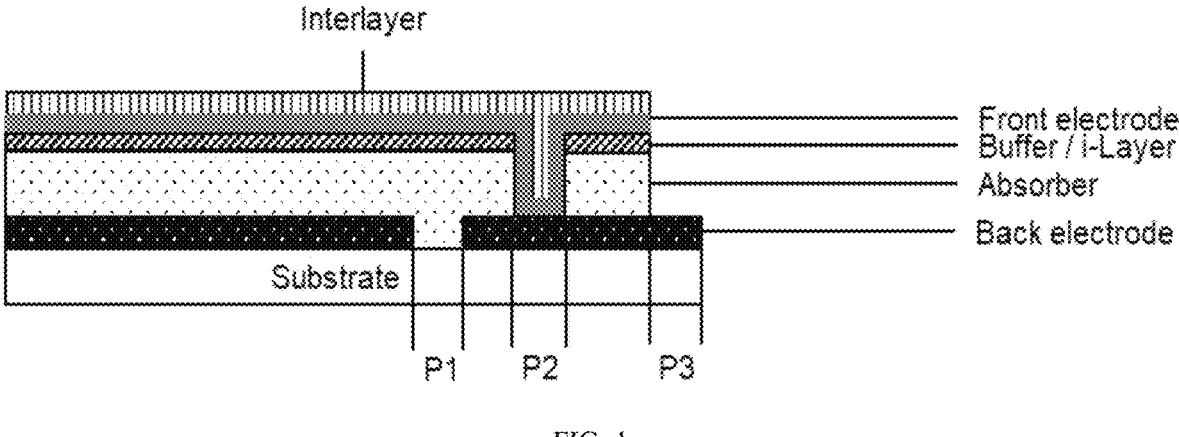
FIG. 1 shows a schematic structural diagram of a layer stack for standard thin-film solar cells.
Figure 2:
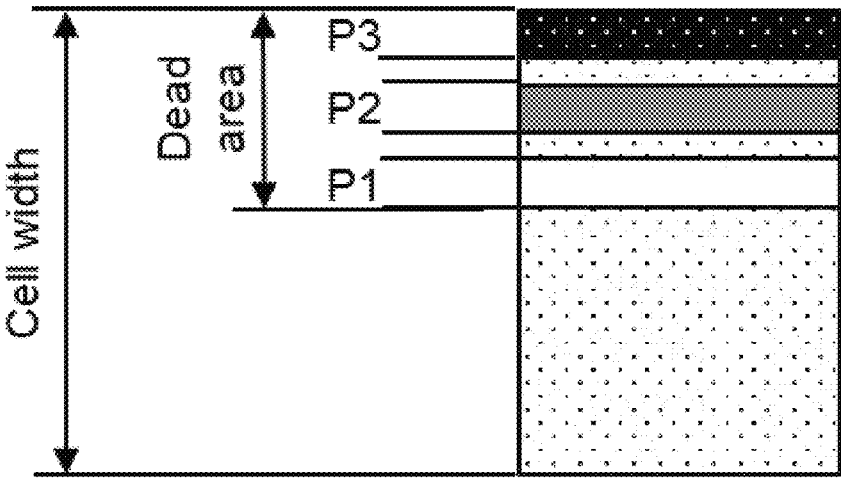
FIG. 2 shows a schematic structural diagram of a cell width and a dead area of a standard thin-film solar cell as a top view.
Figure 3:
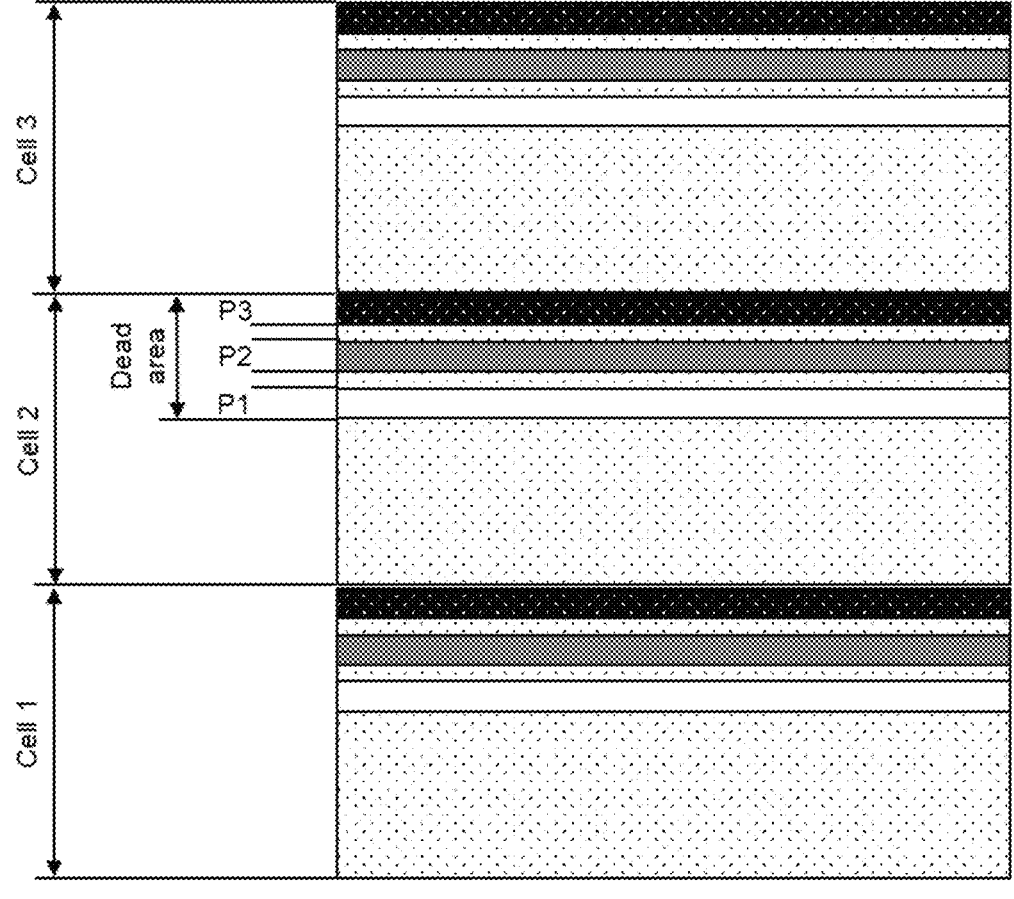
FIG. 3 shows the interconnection of three cells of a standard thin-film photovoltaic module as a top view.

In addition, all layers in a cell is interconnected, as shown in FIG. 1. It can be seen that a layer stack is divided by P1, P2 and P3 structure lines, respectively. It should be noted that P1 and P3 insulate the front electrode from the back electrode, and P2 serves as an electrical contact between the front electrode and the back electrode for the connection of two adjacent cells in series. Because the structural area of P1/P2/P3 does not generate electricity, it is usually called a "dead area", as shown in FIG. 2.

Figure 4:
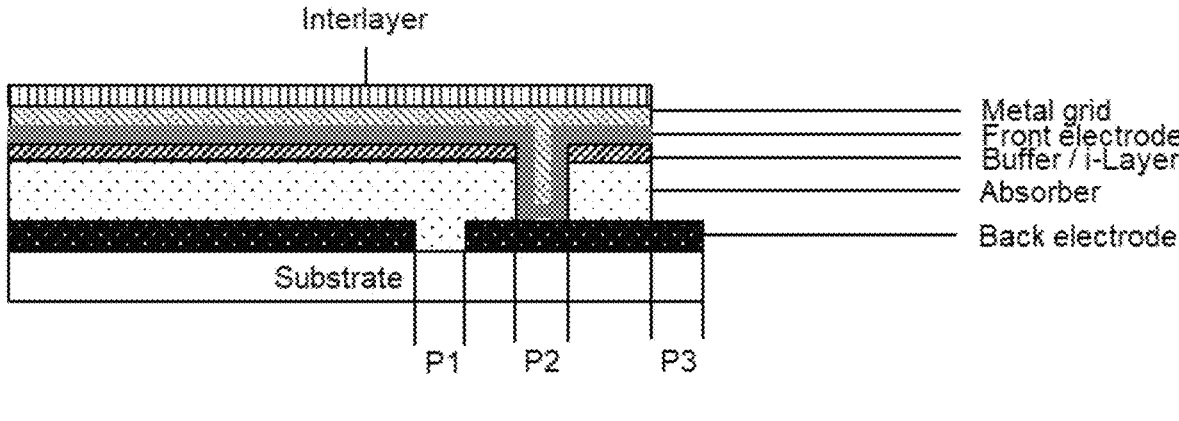
FIG. 4 shows the lamination of a thin-film solar cell with a standard metal grid structure deposited on a front electrode in a cross-sectional view.
Figure 5:
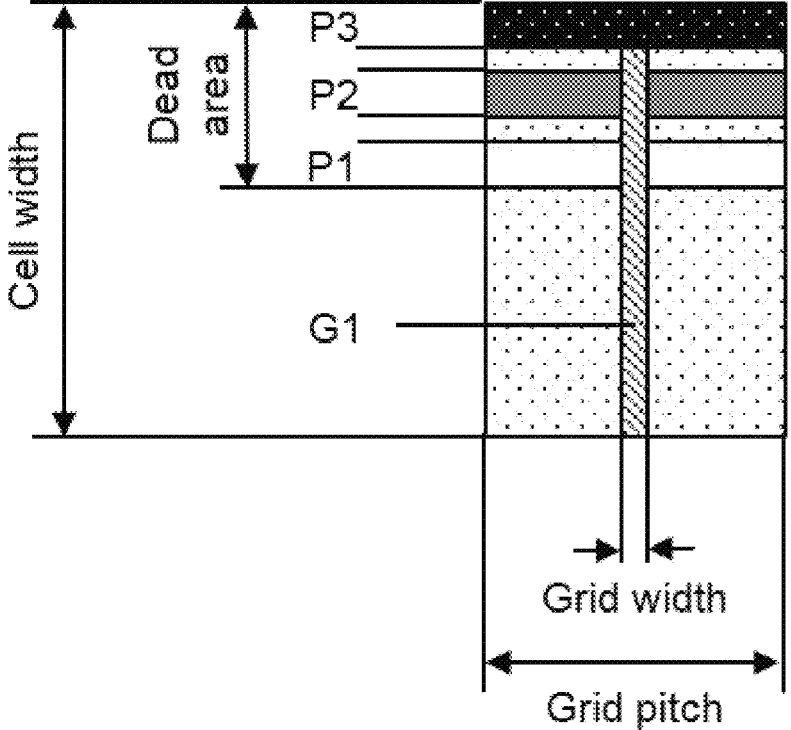
FIG. 5 shows a schematic diagram of the thin-film solar cell with the standard metal grid structure deposited on the front electrode as a top view.
Figure 6:
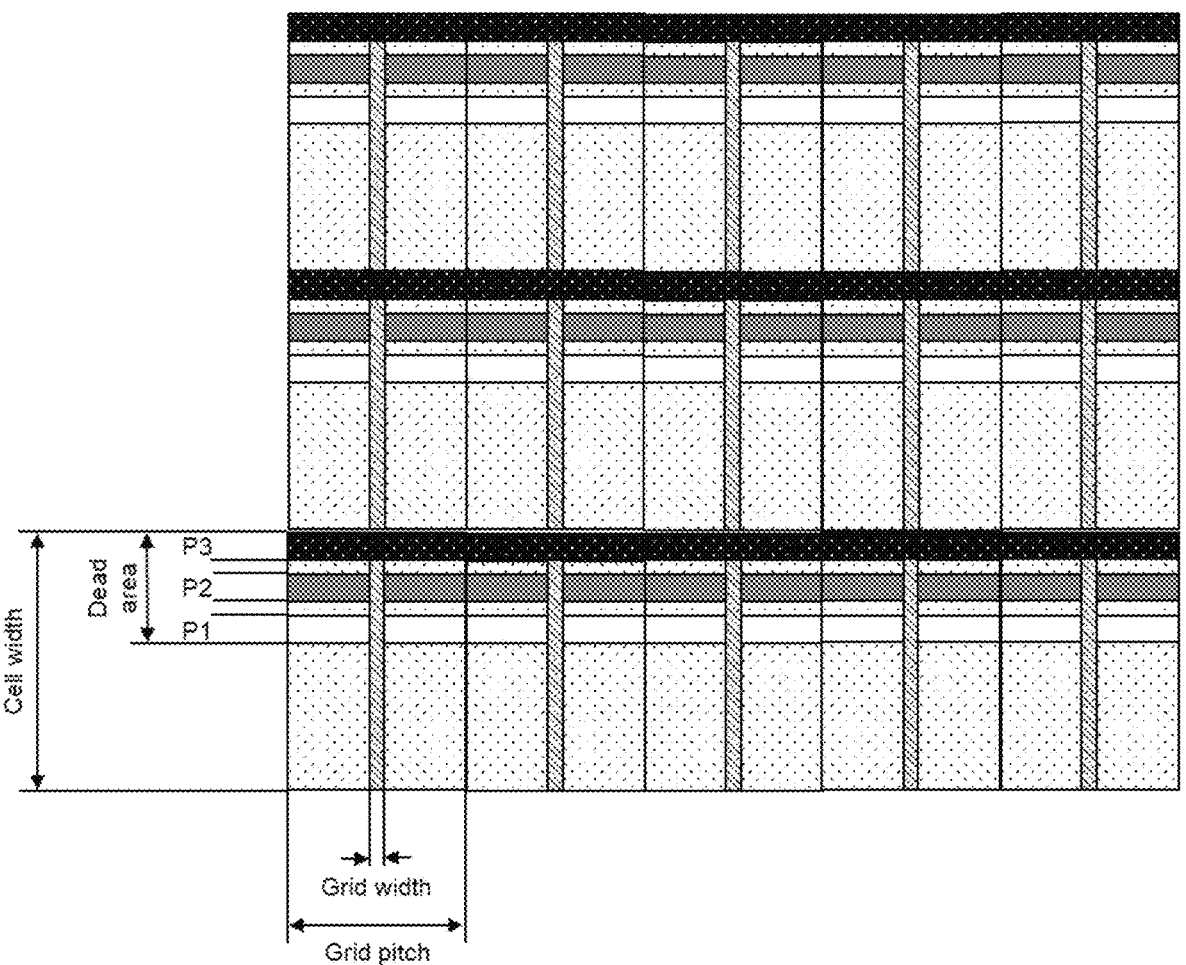
FIG. 6 shows a schematic diagram of the interconnection of the three cells of the thin-film photovoltaic module on the front electrode with the standard metal grid as a top view.

In order to optimize the power conversion efficiency of solar cells, a method will usually be taken into consideration, e.g. increasing the transmissivity of the front electrode by reducing the layer thickness of the front electrode and further increasing photocurrent generated. However, this will lead to an increase in sheet resistivity of the front electrode, resulting in conduction loss. To reduce this kind of conduction loss in the front electrode, a narrow metal grid with high conductivity may be applied on the front electrode layer to improve the related conductivity, which is the metallization process of photovoltaic production. Therefore, the metal grid structure is applied transversely to the cell at periodic intervals or perpendicular to P1/P2/P3, as shown in FIGS. 4, 5 and 6. It can be seen that the grid line is continuously applied to the solar cell. P3 interrupts the grid line to prevent short-circuiting between the front electrode of one cell and its adjacent cell.

Figure 7:
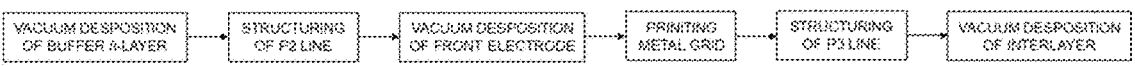
FIG. 7 shows a schematic diagram of the sequence of a selected production process (including a buffer/i-layer, a P2 structure line, a front electrode, a metal grid, a P3 structure line, and an interlayer) for a thin-film/CIGS photovoltaic module according to an embodiment of the standard metal grid layer stack.
Figure 8:
FIG. 8 shows a schematic diagram of the sequence of a selected production process (including a buffer/i-layer, a P2 structure line, a front electrode, a metal grid, an interlayer, and a P3 structure line) for a thin-film/CIGS photovoltaic module according to another embodiment of the standard metal grid layer stack.

At present, FIGS. 7 and 8 show two examples of a thin-film photovoltaic module production sequence. There exists vacuum breaking between the deposition of the front electrode 6 and the interlayer 7. Therefore, when two layers can be sequentially deposited in the same vacuum coating machine, it is possible to reduce cost. The resulting layer sequence is described in the previous section (see FIG. 4). An alternative layer stack for thin-film photovoltaic devices with metallized layers, as in the present invention, has not been published yet.

Figure 9:
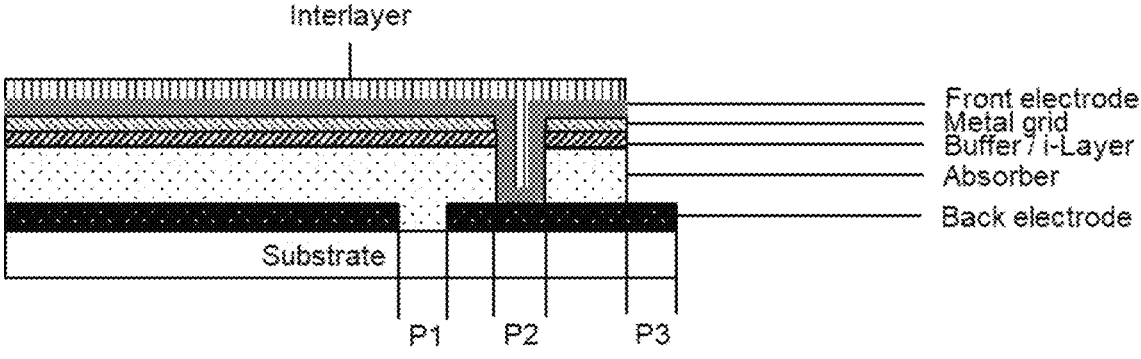
FIG. 9 shows a cross-sectional view of the layer stack of the thin-film solar cell with the embedded metal grid structure under the front electrode and the interlayer according to an embodiment of the sequence of an embedded grid process of FIG. 12.
Figure 10:
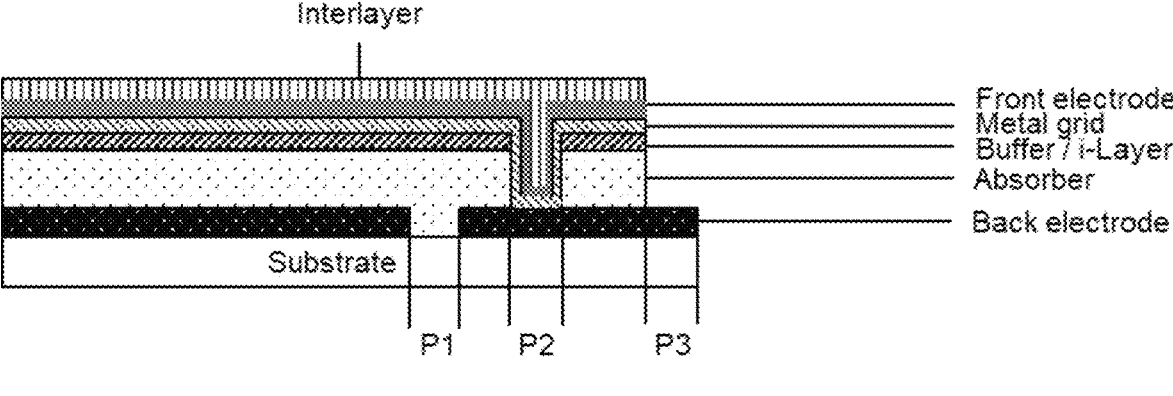
FIG. 10 shows a cross-sectional view of the layer stack of the thin-film solar cell with the embedded metal grid structure under the front electrode and the interlayer according to another embodiment of the sequence of the embedded grid process of FIG. 13.
Figure 11:
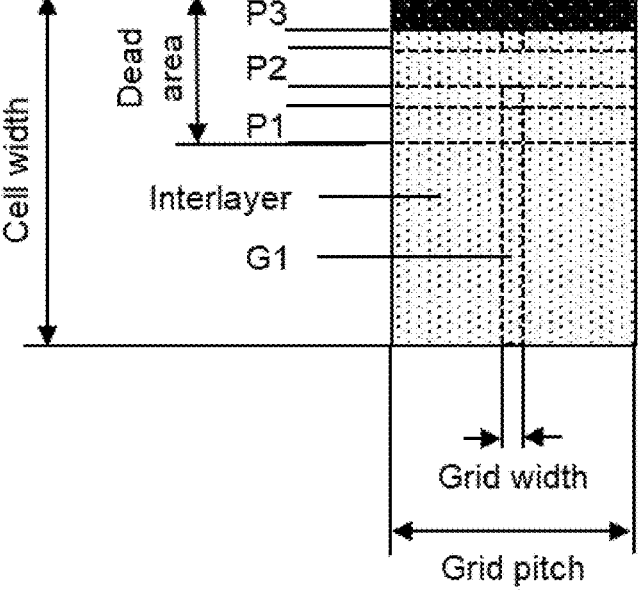
FIG. 11 shows a schematic diagram of a thin-film solar cell with an embedded metal grid structure deposited under a front electrode and an interlayer as a top view.
Figure 12:
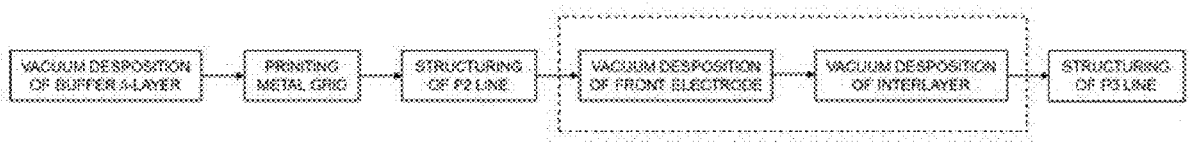
FIG. 12 shows a schematic diagram of the sequence of a selected production process (including a buffer/i-layer, a metal grid, a P2 structure line, a front electrode, an interlayer, and a P3 structure line) for a thin-film/CIGS photovoltaic module according to an embodiment of the embedded metal grid layer stack.
Figure 13:
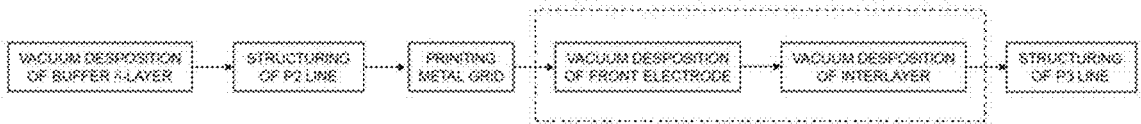
FIG. 13 shows a schematic diagram of the sequence of a selected production process (including a buffer/i-layer, a P2 structure line, a metal grid, a front electrode, an interlayer, and a P3 structure line) for a thin-film/CIGS photovoltaic module according to another embodiment of the embedded metal grid layer stack.

Specific embodiments of the present invention are as follows:

As shown in FIGS. 9 to 11, a layer stack for thin-film photovoltaic modules is composed of a back electrode, an absorber, a buffer/i-layer, a front electrode and an interlayer which are sequentially stacked on a corresponding substrate from bottom up by vacuum coating deposition; the layer stack is divided by P1, P2 and P3 structure lines respectively;

a conductive metal grid is embedded in the layer stack, and the metal grid is deposited on the buffer/i-layer before or after the P2 structure line.

By adopting the aforementioned technical solution, the conductive metal grid is embedded in the layer stack, and the metal grid is deposited on the buffer/i-layer before or after the P2 structure line, thereby forming an embedded grid, and thus, the front electrode and the interlayer can be deposited without breaking vacuum in the process sequence; and compared with the application of a standard thin-film pho- tovoltaic modules on a front electrode, such an embedded grid shows great advantages in reducing capital expenditure and operating cost.

As shown in FIG. 2, the layer stack is also provided with a pattern area, which includes a P1 patterned line groove with the back electrode removed, a P2 patterned line groove close to the P1 structure line with the absorber removed, and a P3 patterned line groove close to the P2 structure line, the metal grid is perpendicular to the P1, P2 and P3 structure lines, and the metal grid outside the pattern area is located between the buffer/i-layer and the front electrode.

By adopting the aforementioned technical solution, the pattern area, the P1 patterned line groove, the P2 patterned line groove and the P3 patterned line groove are marked in the drawings.

By adopting the aforementioned technical solution, the pattern area including the P1, P2 and P3 structure lines creates a single-chip series interconnection structure in the CIGS module.

As shown in FIG. 9, the P2 patterned line groove does not contain the material of the metal grid, and the metal grid outside the pattern area between the buffer/i-layer and the front electrode is interrupted by the P2 patterned line groove, so that the electrical P2 contact in the P2 patterned line groove is formed into an electrode only in the sequence of the front electrode and the back electrode. As shown in FIG. 10, the P2 patterned line groove contains the material of the metal grid coated with the front electrode material, so that the electric P2 contact is formed into an electrode in the sequence of the front electrode, the metal grid material and the back electrode.

Forming electrodes according to the above two orders is a possible choice as a solar module device, and there is no difference in relevant advantages. It only shows that for the application of buried grids, they are possible and will not cause any problems.

Preferably, the metal grid is made of any of silver, copper, and aluminum.

Preferably, the metal grid is deposited by different solution deposition methods.

Preferably, the solution deposition method is any of inkjet printing, aerosol printing, screen printing, and electroplating.

Preferably, a solvent of conductive ink applied to the metal grid does not directly dissolve or react with the buffer/i-layer.

By adopting the aforementioned technical solution, in order to realize such modification, as a prerequisite, a solvent of conductive ink applied to the metal grid does not directly dissolve or react with the buffer/i-layer; otherwise, the application of the metal grid will affect the electrical properties of the buffer/i-layer and deteriorate the interface.

Preferably, the surface tension of the conductive ink is greater than the surface energy of the buffer/i-layer.

By adopting the aforementioned technical solution, the applied conductive ink needs to be selected/reformulated as conductive ink with surface tension far greater than the surface energy of the buffer/i-layer, that is, the conductive ink expected to be applied has less wettability to the buffer/i-layer. If the surface energy of the buffer/i-layer is higher than that of the front electrode, some additives should be added to increase the surface tension of the conductive ink.

The less the wettability of the conductive ink used, the narrower the grid line, that is, the less the light loss caused by the shadow of the grid line.

Preferably, the surface energy of the buffer/i-layer is lower than that of the front electrode.

By adopting the aforementioned technical solution, if the surface energy of the buffer/i-layer is lower than that of the front electrode, the embedded grid will have the advantage of less grid line width compared with the standard grid on the front electrode.

Preferably, the front electrode is made of a transparent conductive oxide material.

Preferably, the front electrode is made of any of aluminum-doped zinc oxide, boron-doped zinc oxide, indium-doped zinc oxide, indium-doped tin oxide, and fluorine-doped tin oxide.

Preferably, the interlayer is made of a non-conductive transparent material, and its refractive index is between that of glass and laminated foil and that of transparent conductive oxides.

Preferably, the interlayer is made of any of silicon nitride and aluminum oxide.

As shown in FIGS. 9 to 13, a preparation method for the layer stack for thin-film photovoltaic modules includes the following steps:

depositing a cell stack with a back electrode first; removing the back electrode to form the cell separation of a P1 structure line; then depositing an absorber and a buffer/i-layer, and a P2 patterned line groove beside the P1 structure line being a P2 patterned line groove formed by first removing the absorber and then depositing a metal grid perpendicular to the P1 structure line and the P2 structure line or first depositing a metal grid perpendicular to the P1 structure line and then removing the metal grid and the absorber; then depositing a front electrode and an interlayer, and forming a P3 patterned line groove beside the P2 structure line, so that the P1 structure line and the P3 structure line are positioned at different sides of the P2 structure line by removing at least the front electrode material, and the metal grid being perpendicularly positioned between the buffer/i-layer and the front electrode.

By adopting the aforementioned technical solution, the method cooperates with the embedded grid of the layer stack, so that the deposition of the front electrode and the interlayer can be carried out in a continuous vacuum coating process without vacuum breaking.

What is described above is merely the preferred embodiment of the present invention, and is not used to limit the present invention, and any modifications, equivalent replacement, improvements and the like which are made within the spirit and principle of the present invention shall fall within the protection scope of the present invention.

What is claimed is:

1. A layer stack for thin-film photovoltaic modules, comprising a back electrode, an absorber, a buffer/i-layer, a front electrode and an interlayer, wherein the back electrode, the absorber, the buffer/i-layer, the front electrode and the interlayer are sequentially stacked on a substrate from bottom up by vacuum coating deposition; the layer stack is divided by a P1 structure line, a P2 structure line and a P3 structure line respectively;

a conductive metal grid is embedded in the layer stack, and the conductive metal grid is deposited on the buffer/i-layer before or after the P2 structure line; wherein the P2 structure line comprises a patterned line groove that contains the material of the conductive metal grid, the material in the groove being coated with the front electrode material to form a P2 contact comprising the front electrode, the conductive metal grid, and the back electrode.

2. The layer stack for the thin-film photovoltaic modules according to claim 1, wherein the layer stack is also provided with a pattern area, wherein the pattern area comprises a P1 patterned line groove with the back electrode removed, a P2 patterned line groove adjacent to the P1 structure line with the absorber removed, and a P3 patterned line groove adjacent to the P2 structure line, wherein the conductive metal grid is perpendicular to the P1 structure line, the P2 structure line and the P3 structure line, and the conductive metal grid outside the pattern area is located between the buffer/i-layer and the front electrode.

3. The layer stack for the thin-film photovoltaic modules according to claim 1, wherein the conductive metal grid is made of any of silver, copper and aluminum.

4. The layer stack for the thin-film photovoltaic modules according to claim 3, wherein the conductive metal grid is deposited by a solution deposition method.

5. The layer stack for the thin-film photovoltaic modules according to claim 4, wherein the solution deposition method is any of inkjet printing, aerosol printing, screen printing and electroplating.

6. The layer stack for the thin-film photovoltaic modules according to claim 5, wherein a solvent of conductive ink applied to the conductive metal grid does not directly dissolve or react with the buffer/i-layer.

7. The layer stack for the thin-film photovoltaic modules according to claim 6, wherein a surface tension of the conductive ink is greater than a surface energy of the buffer/i-layer.

8. The layer stack for the thin-film photovoltaic modules according to claim 7, wherein the surface energy of the buffer/i-layer is lower than a surface energy of the front electrode.

9. The layer stack for the thin-film photovoltaic modules according to claim 1, wherein the front electrode is made of a transparent conductive oxide material.

10. The layer stack for the thin-film photovoltaic modules according to claim 9, wherein the front electrode is made of any of aluminum-doped zinc oxide, boron-doped zinc oxide, indium-doped zinc oxide, indium-doped tin oxide, and fluorine-doped tin oxide.

11. The layer stack for the thin-film photovoltaic modules according to claim 1, wherein the interlayer is made of a non-conductive transparent material, and a refractive index of the non-conductive transparent material is between a refractive index of glass and laminated foil and a refractive index of transparent conductive oxides.

12. The layer stack for the thin-film photovoltaic modules according to claim 11, wherein the interlayer is made of any of silicon nitride and aluminum oxide.

13. A preparation method for the layer stack for the thin-film photovoltaic modules according to claim 2, comprising the following steps:

depositing a cell stack with the back electrode first; removing the back electrode to form a cell separation of the P1 structure line; then depositing the absorber and the buffer/i-layer, and the P2 patterned line groove beside the P1 structure line being the P2 patterned line groove formed by first removing the absorber and then depositing the conductive metal grid perpendicular to the P1 structure line and the P2 structure line or first depositing the conductive metal grid perpendicular to the P1 structure line and then removing the conductive metal grid and the absorber; then depositing the front electrode and the interlayer, and forming the P3 patterned line groove beside the P2 structure line, so that the P1 structure line and the P3 structure line are positioned at different sides of the P2 structure line by removing at least the front electrode material, and the conductive metal grid being perpendicularly positioned between the buffer/i-layer and the front electrode.

* * * * *